United States Patent
Hou et al.

(10) Patent No.: US 8,431,452 B2
(45) Date of Patent: Apr. 30, 2013

(54) TFT-LCD ARRAY SUBSTRATE AND MANUFACTURING METHOD THEREOF

(75) Inventors: Zhi Hou, Beijing (CN); Jae Yun Jung, Beijing (CN); Yunyou Zheng, Beijing (CN); Hongxi Xiao, Beijing (CN); Wei Li, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/338,608

(22) Filed: Dec. 28, 2011

(65) Prior Publication Data
US 2012/0094409 A1   Apr. 19, 2012

Related U.S. Application Data

(62) Division of application No. 12/504,829, filed on Jul. 17, 2009, now abandoned.

(30) Foreign Application Priority Data

Jul. 18, 2008   (CN) .......................... 2008 1 0116878

(51) Int. Cl.
*H01L 21/84*   (2006.01)
(52) U.S. Cl.
USPC .............. 438/164; 438/30; 438/149; 438/151
(58) Field of Classification Search ................. 349/42, 349/43; 257/E29.273, 59, 72; 438/30, 149, 438/151, 164
See application file for complete search history.

(56) References Cited

U.S. PATENT DOCUMENTS

| | | | |
|---|---|---|---|
| 5,121,236 A | | 6/1992 | Ukai et al. |
| 6,025,216 A | * | 2/2000 | Ha .................................. 438/161 |
| 6,323,521 B1 | * | 11/2001 | Seo ................................. 257/347 |
| 6,392,628 B1 | | 5/2002 | Yamazaki et al. |
| 2002/0164888 A1 | * | 11/2002 | Roh et al. ....................... 438/754 |
| 2008/0106538 A1 | | 5/2008 | Ko et al. |

FOREIGN PATENT DOCUMENTS

| | | |
|---|---|---|
| CN | 1987622 A | 6/2007 |
| JP | 6-268218 A | 9/1994 |

OTHER PUBLICATIONS

USPTO RR mailed Apr. 1, 2011 in connection with U.S. Appl. No. 12/504,829.
USPTO NFOA mailed Jul. 1, 2011 in connection with U.S. Appl. No. 12/504,829.
USPTO FOA mailed Oct. 3, 2011 in connection with U.S. Appl. No. 12/504,829.

* cited by examiner

*Primary Examiner* — N Drew Richards
*Assistant Examiner* — Yu-Hsi D Sun
(74) *Attorney, Agent, or Firm* — Ladas & Parry LLP

(57) ABSTRACT

A liquid crystal display (LCD) array substrate and a manufacturing method thereof are provided. The manufacturing method comprises depositing a semiconductor layer, a doped semiconductor layer and a metal film for source and drain electrodes sequentially on a base substrate and then forming a data line, a source electrode, a drain electrode and a thin film transistor (TFT) channel region by a first patterning process; depositing a first insulating film and a gate metal film sequentially and then forming a gate line and a gate electrode by a second patterning process and forming an insulating layer via hole in the first insulating layer above the drain electrode; depositing a transparent conductive film and then forming a pixel electrode by a third patterning process; and forming a second insulating layer.

6 Claims, 6 Drawing Sheets

B - B

TFT-LCD ARRAY SUBSTRATE AND MANUFACTURING METHOD THEREOF

BACKGROUND

Embodiments of the present invention relate to a liquid crystal display array substrate (LCD) and a manufacturing method thereof.

Thin film transistor liquid crystal displays (TFT-LCDs) possess advantages of small volume, low power consumption, low radiation, etc., and are gradually prevailing in the market of flat plate displays. As for a TFT-LCD, an array substrate and the manufacturing method thereof control, to a large extent, the performance, yield, and price of the final products. In order to efficiently reduce the production cost of TFT-LCDs and improve yield, the manufacturing process of a TFT-LCD array substrate is gradually simplified. Such manufacturing processes have been evolving from initial 7-mask processes to current 4-mask processes for example based on slit photolithography technology. Besides, 3-mask processes are under research and development.

One 3-mask process has been proposed in Chinese patent application CN 200510132423.X, in which a gate line and a gate electrode are formed through a patterning process with a first normal mask; a data line, a source electrode, a drain electrode, and a thin film transistor (TFT) channel region are then formed through a patterning process with a second gray tone mask; and a pixel electrode is finally formed through a patterning process with a third normal mask. In the third patterning process of this method, a transparent conductive film is directly formed on the surface of the photoresist for patterning by sputtering, and then the transparent pixel electrode is formed with directly contacting with the surface of the drain electrode by lifting off. In practice, the photoresist is prone to be modified during the sputtering process, thus the pixel region can be polluted and formation of the transparent conductive film by sputtering can fail. Furthermore, the pixel electrode performance is very important to the whole TFT-LCD array substrate and has a great influence on the display quality. Therefore, it is needed that the 3-mask process is improved so as to avoid the problems mentioned above.

SUMMARY OF THE INVENTION

An embodiment of the present invention provides a liquid crystal display (LCD) array substrate comprising a gate line, a data line, a pixel electrode and a thin film transistor. The thin film transistor comprises: a semiconductor layer and a doped semiconductor layer formed on a base substrate sequentially; a source electrode and a drain electrode formed on the doped semiconductor layer, wherein a thin film transistor (TFT) channel region is formed between the source electrode and the drain electrode and the source electrode is connected with the data line; a first insulating layer faulted on the source electrode and the drain electrode, in which an insulating layer via hole is formed so that the pixel electrode is connected with the drain electrode through the insulating layer via hole; a gate electrode formed on the first insulating layer and positioned above the TFT channel region, wherein the gate electrode is connected with the gate line; and a second insulating layer formed on the gate line and the gate electrode.

Preferably, a light-shielding layer may be further formed between the substrate and the semiconductor layer.

Another embodiment of the present invention provides a liquid crystal display (LCD) array substrate comprising a gate line, a data line, a pixel electrode and a thin film transistor. The thin film transistor comprises: a semiconductor layer and a doped semiconductor layer formed on a base substrate sequentially; a source electrode and a drain electrode formed on the doped semiconductor layer, wherein a thin film transistor (TFT) channel region is formed between the source electrode and the drain electrode and the source electrode is connected with the data line; a first insulating layer formed on the source electrode and the drain electrode, in which an insulating layer via hole is formed so that the pixel electrode is connected with the drain electrode through the insulating layer via hole; and a gate electrode formed on the first insulating layer and positioned above the TFT channel region, wherein the gate electrode is connected with the gate line and an insulating metal oxide film is formed on the surface of the gate line and the gate electrode by an oxidation process.

Preferably, a light-shielding layer may be further formed between the substrate and the semiconductor layer.

Still another embodiment of the present invention provides a method for manufacturing a liquid crystal display (LCD) array substrate. The method comprises:

step 1 of depositing a semiconductor layer, a doped semiconductor layer and a metal film for source and drain electrodes sequentially on a base substrate and then forming a data line, a source electrode, a drain electrode and a thin film transistor (TFT) channel region by a first patterning process;

step 2 of depositing a first insulating film and a gate metal film sequentially on the substrate after the step 1 and then forming a gate line and a gate electrode by a second patterning process, wherein an insulating layer via hole is formed in the first insulating layer above the drain electrode, and the gate electrode is positioned above the TFT channel region;

step 3 of depositing a transparent conductive film on the substrate after the step 2 and then forming a pixel electrode by a third patterning process, wherein the pixel electrode is connected with the drain electrode through the insulating layer via hole; and step 4 of forming a second insulating layer on the substrate after the step 3 to cover the gate line and gate electrode.

Specifically, the step 2 of the method may comprise:

step 21 of depositing the first insulating layer on the substrate after step 1 and then depositing the gate metal film;

step 22 of applying a photoresist layer on the gate metal film;

step 23 of performing an exposure and development process so that the photoresist layer is formed into a completely removed region, a partially remained region and a completely remained region, wherein the region where the gate line and the gate electrode are to be formed corresponds to the completely remained region, the region where the insulating layer via hole is to be formed above the drain electrode corresponds to the completely removed region, and the remaining region on the substrate corresponds to the partially remained region;

step 24 of performing a first etching process so that the gate metal film at a position corresponding to the insulating layer via hole is completely removed and the first insulating layer at this position is partially removed in the thickness direction;

step 25 of performing an ashing process to completely remove the photoresist in the partially remained region;

step 26 of performing a second etching process to form the gate line and the gate electrode; and step 27 of performing a third etching process so that the first insulating layer at the position corresponding to the insulating layer via hole is completely removed and the drain electrode is exposed.

Preferably, the step 4 of the method may comprise depositing the second insulating layer on the substrate on which the remained photoresist is not removed after forming the pixel electrode so that the substrate is entirely covered by the second insulating layer and then removing the second insulating layer on the photoresist along with the photoresist by a lifting-off process.

Alternatively, the step 4 of the method may comprise performing a lifting-off process for the photoresist after forming the pixel electrode and then oxidizing the exposed surface of the gate electrode and the gate lines so that an insulating metal oxide film is formed.

In the step 1 of the method, a light-shielding layer may be deposited on the substrate prior to depositing the semiconductor layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE EMBODIMENTS

Figure 1:
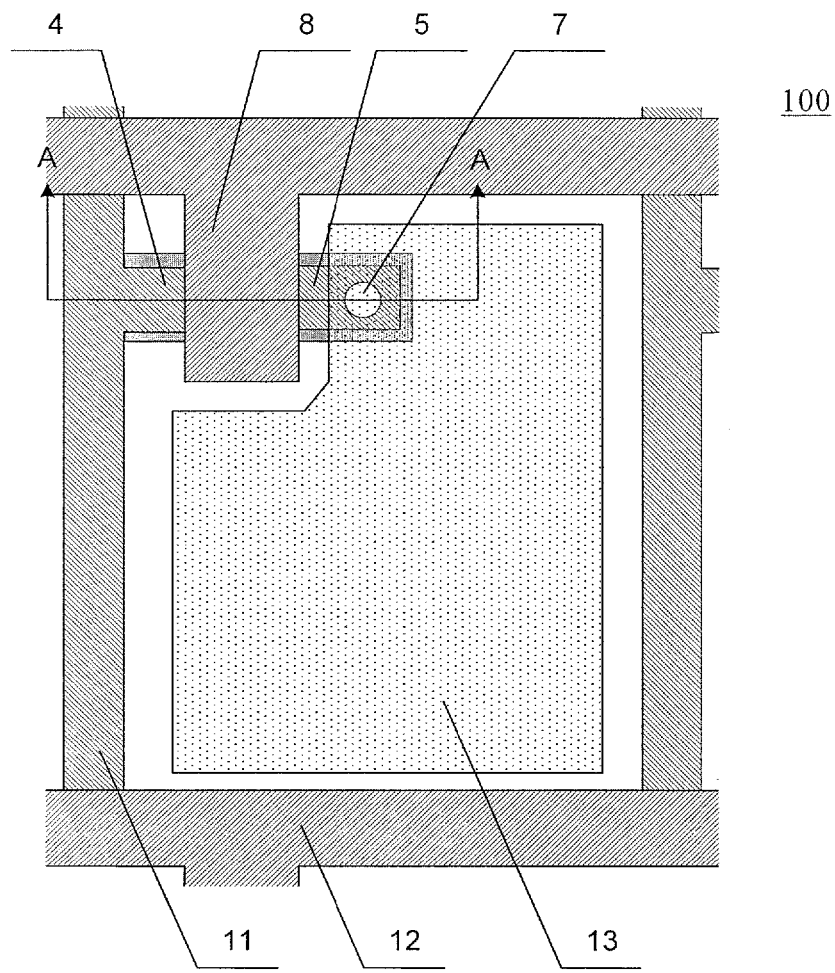
FIG. 1 is a schematic view showing a structure of a TFT-LCD array substrate according to a first embodiment of the present invention.
Figure 2:
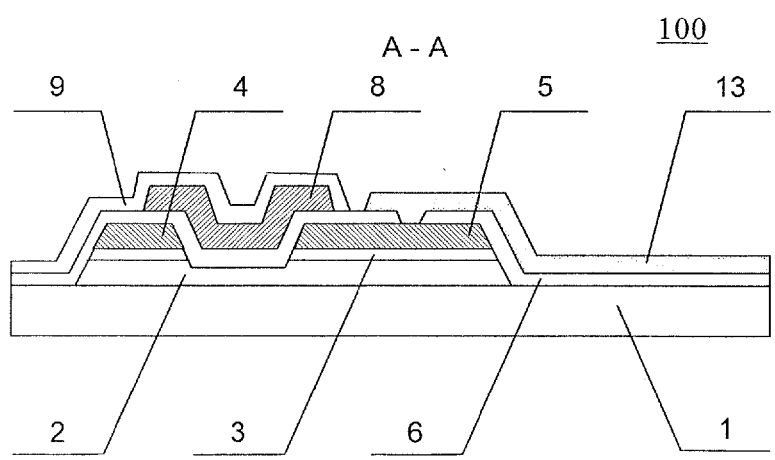
FIG. 2 is a sectional view taken along a line A-A in FIG. 1.

FIG. 1 is a schematic view showing a structure of a TFT-LCD array substrate according to a first embodiment of the present invention; and FIG. 2 is a sectional view taken along a line A-A in FIG. 1. For example, the array substrate 100 of the present embodiment comprises a plurality of data lines 11 and a plurality of gate lines 12 perpendicular to and insulated from the date lines on a base substrate 1, a plurality of pixel regions are defined by the intersections between the data lines 11 and the gate lines 12, thin film transistors (TFTs) are each formed at the intersections for the pixel regions, and pixel electrodes 13 are each formed in the pixel regions. Each TFT of the present embodiment for example comprises a semiconductor layer 2 and a doped semiconductor layer 3 formed on the base substrate 1, a source electrode 4 and a drain electrode 5 formed on the doped semiconductor layer 3, a TFT channel region formed between the source electrode 4 and the drain electrode 5, a first insulating layer 6 formed on the source electrode 4 and the drain electrode 5 to cover the base substrate 1, an insulating layer via hole 7 formed in the first insulating layer 6 above the drain electrode 5, a gate electrode 8 formed on the first insulating layer 6 and located above the position of the TFT channel region, and a second insulating layer 9 formed on the gate electrode 8. As shown in FIG. 1 and FIG. 2, the gate lines 12 is connected with the gate electrode 8, the data line 11 is connected with the source electrode 4, and the pixel electrode 13 is connected with the drain electrode 5 through the insulting layer via hole 7. For example, the first insulating layer 6 may be a passivation layer, and the second insulating layer 9 may be a gate insulating layer.

FIG. 3 to FIG. 10 are schematic views showing the processes for manufacturing a TFT-LCD array substrate according to a first embodiment of the present invention. Generally, hereinafter, a patterning process may comprise the processes of coating a layer of photoresist, exposing and developing the photoresist, etching an underlying layer, lifting off the photoresist and the like. In the following embodiments, for example, a positive photoresist is used.

Figure 3:
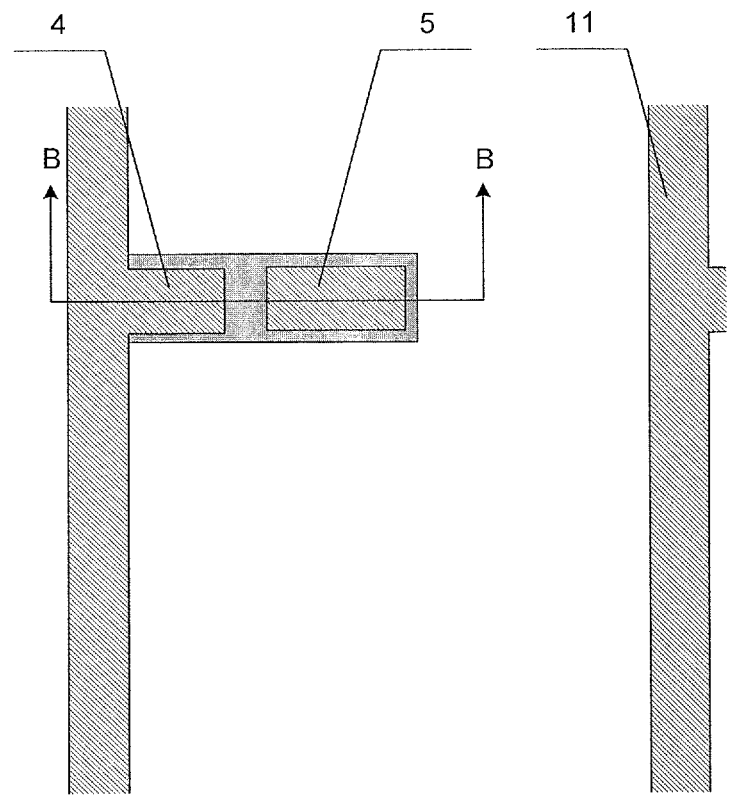
FIG. 3 is a plane view showing a TFT-LCD array substrate after a first patterning process according to the first embodiment of the present invention.
Figure 4:
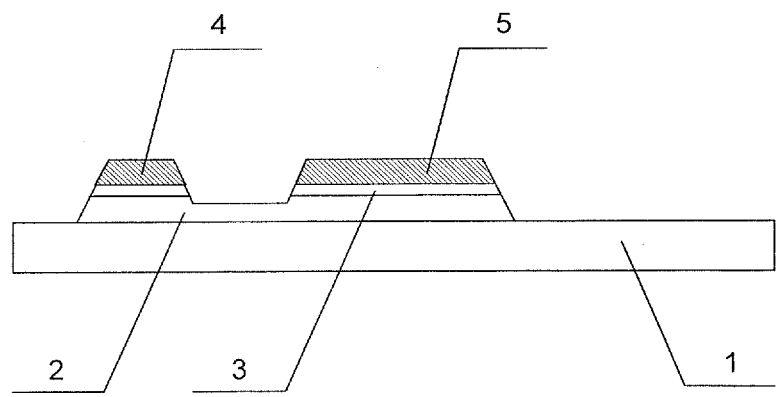
FIG. 4 is a sectional view taken along a line B-B in FIG. 3.

FIG. 3 is a plane view showing a TFT-LCD array substrate after a first patterning process; and FIG. 4 is a sectional view taken along a line B-B in FIG. 3. Firstly, a semiconductor layer 2 and a doped semiconductor layer (ohmic contact layer) 3 are deposited sequentially on a base substrate (e.g., a glass substrate or a quartz substrate) for example by a chemical vapor deposition method or the like. The semiconductor layer 2 and the doped semiconductor layer 3 constitute an active layer. Then a metal film for source and drain electrodes is deposited for example by a magnetron sputtering method, a thermal evaporation method or the like. The metal film for source and drain electrodes may be a single layer of molybdenum, aluminum, aluminum neodymium alloy, tungsten, chromium, copper or the like or a multilayer of two or more metals selected form above-mentioned metals. The doped semiconductor layer 3 is used to improve the electrical conductivity between the semiconductor layer 2 and the metal film for source and drain electrodes, and the doped semiconductor layer 3 is also referred to as an ohmic contact layer. If the materials respectively used for the semiconductor layer 2 and the metal film for source and drain electrodes can have desirable conductivity therebetween, a structure without the doped semiconductor layer 3, i.e., a structure in which the metal film for source and drain electrodes is directly deposited on the semiconductor layer may be used. The semiconductor layer, the doped semiconductor layer and the metal film for source and drain electrodes are patterned with a gray-tone mask (including a half-tone mask) by a first patterning process, thereby a data line 11, a source electrode 4, a drain electrode 5, and a TFT channel region are formed for each pixel region on the substrate. As shown in FIG. 3 and FIG. 4, the doped semiconductor layer 3 between the source electrode 4 and the drain electrode 5 is etched away completely so as to expose the underlying semiconductor layer 2. The above-described process for forming the data line, the source electrode, the drain electrode and the TFT channel region through a gray-tone mask has been widely used, thus the details thereof are omitted here.

Figure 5:
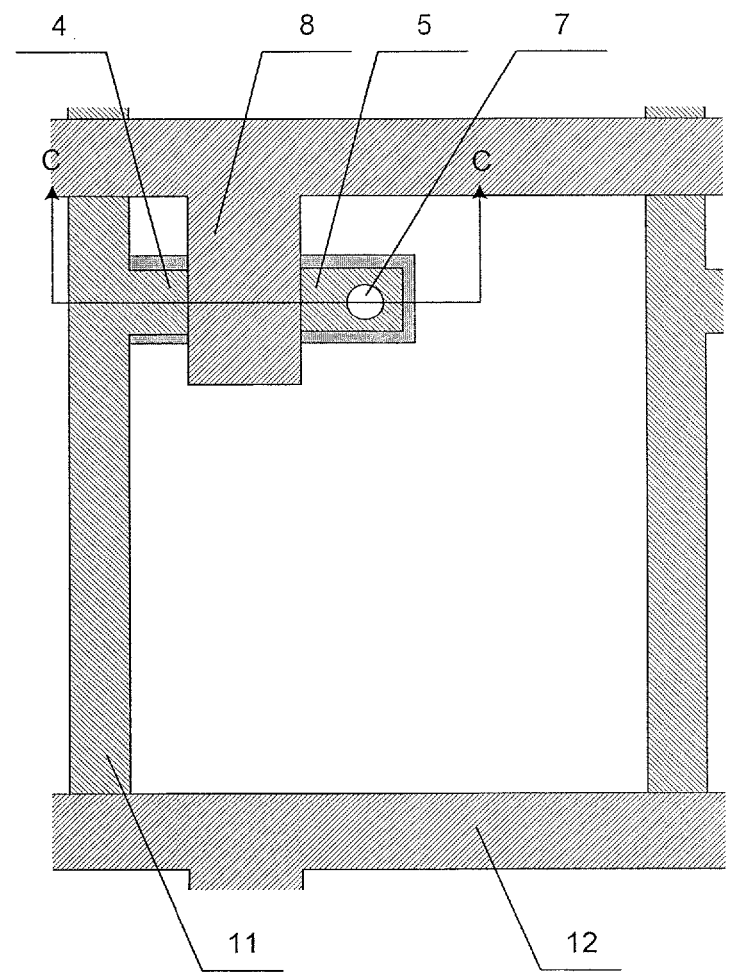
FIG. 5 is a plane view showing a TFT-LCD array substrate after a second patterning process according to the first embodiment of the present invention.
Figure 6:
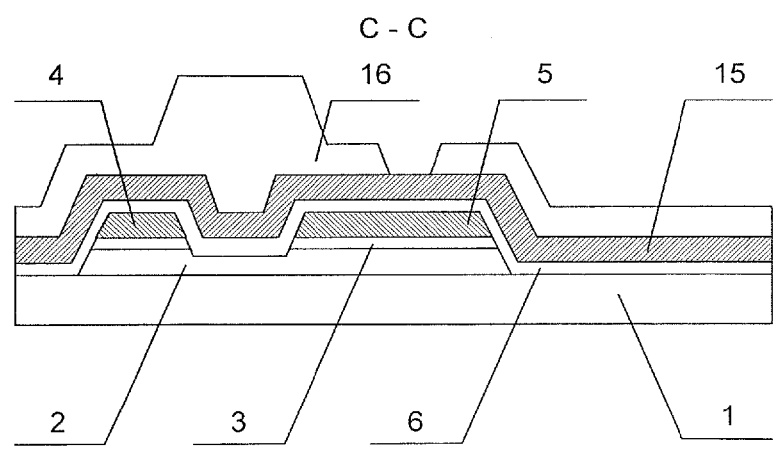
FIG. 6 is a schematic view showing a TFT-LCD array substrate after an exposing and developing process for photoresist during the second patterning process according to the first embodiment of the present invention.

FIG. 5 is a plane view showing a TFT-LCD array substrate after a second patterning process according to the first embodiment of the present invention; and FIG. 6 is a sectional view taken along a line C-C in FIG. 5 and showing the TFT-LCD array substrate after an exposing and developing process for photoresist during the second patterning process. A first insulating layer 6 is deposited for example by a chemical vapor deposition method or the like on the substrate with the above-described patterns, and then a gate metal film 15 is deposited for example by a magnetron sputtering method, a thermal evaporation method or the like. For example, the gate metal film 15 may be a single layer of molybdenum, aluminum, aluminum neodymium alloy, tungsten, chromium, copper or the like or a multilayer of two or more metals selected form above-mentioned metals. A photoresist layer 16 is applied on the gate metal film 15, and then exposed through a gray-tone mask so as to form a completely exposed region (i.e., a region where the photoresist is to be removed completely), a partially exposed region (i.e., a region where the photoresist is to be remained partially), and an un-exposed region (i.e., a region where the photoresist is to be remained completely). On the substrate, the region where a gate line and a gate electrode that are to be formed corresponds to the un-exposed region, the region where an insulating layer via hole to be formed above the drain electrode corresponds to the completely exposed region, and the remaining region corresponds to the partially exposed region. After development of the photoresist layer that has been exposed, as shown in FIG. 6, the photoresist in the completely exposed region is completely removed, the photoresist in the partially exposed region is partially removed, and the photoresist in the un-exposed region is completely remained.

Figure 7:
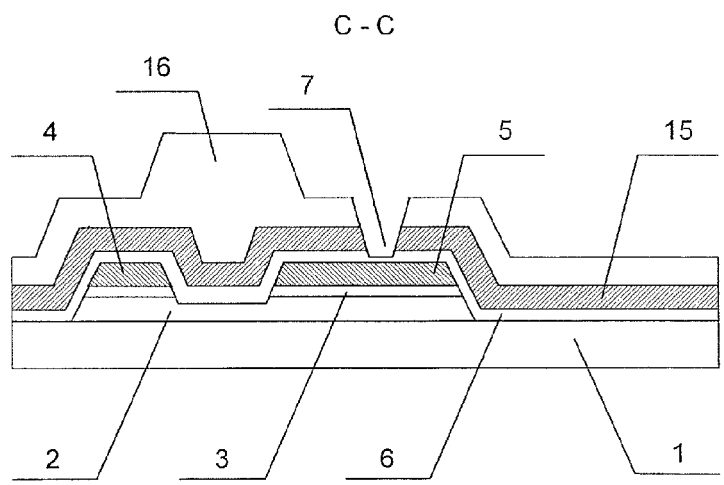
FIG. 7 is a schematic view showing a TFT-LCD array substrate after a first etching process during the second patterning process according to the first embodiment of the present invention.

FIG. 7 is a sectional view taken along the line C-C in FIG. 5 and showing the TFT-LCD array substrate after a first etching process during the second patterning process. An etching process is performed so that the gate metal film 15 exposed by the photoresist is completely removed and the first insulating layer 6 is partially removed in the thickness direction to form an insulating layer via hole 7 on the first insulating layer 6. As shown in FIG. 7, the insulating layer via hole 7 is formed above the drain electrode 5, and since the first insulating layer 6 is partially removed in the thickness direction, the first insulating layer 6 with the remaining thickness is left at the bottom of the insulating layer via hole 7. The above-described process is a half-etching process, which can be completed by increasing the thickness of the insulating layer in conjunction with controlling the extent of the etching process.

Figure 8:
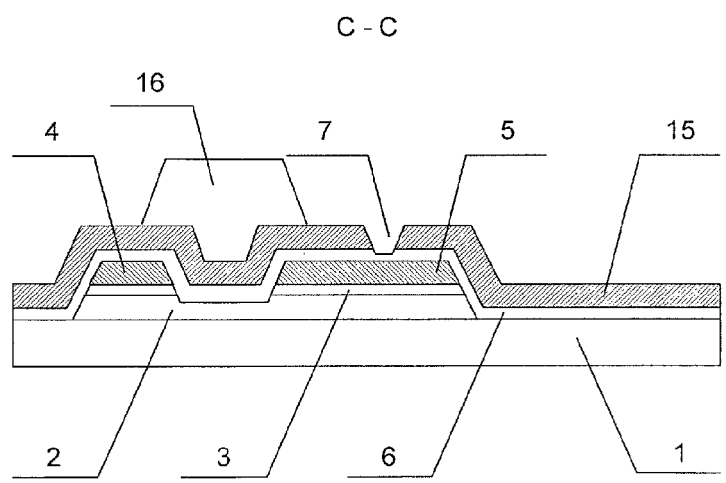
FIG. 8 is a schematic view showing a TFT-LCD array substrate after an ashing process during the second patterning process according to the first embodiment of the present invention.

FIG. 8 is a sectional view taken along the line C-C in FIG. 5 and showing the TFT-LCD array substrate after an ashing process during the second patterning process. As shown in FIG. 8, after the ashing process, the photoresist in the partially exposed region is removed completely, and the photoresist in the un-exposed region still covers the region where the gate line and the gate electrode are to be formed, but its thickness is reduced.

Figure 9:
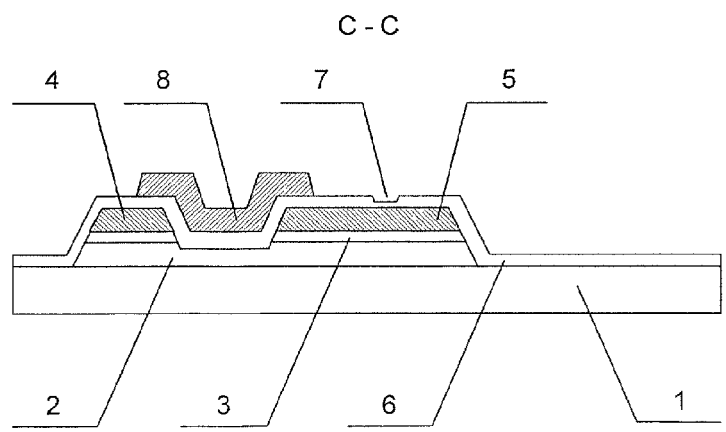
FIG. 9 is a schematic view showing a TFT-LCD array substrate after a second etching process during the second patterning process according to the first embodiment of the present invention.

FIG. 9 is a sectional view taken along the line C-C in FIG. 5 and showing the TFT-LCD array substrate after a second etching process during the second patterning process. The gate metal film 15 exposed by the photoresist is etched to form the gate line 12 and the gate electrode 8 above the TFT channel region, as shown in FIG. 9.

Figure 10:
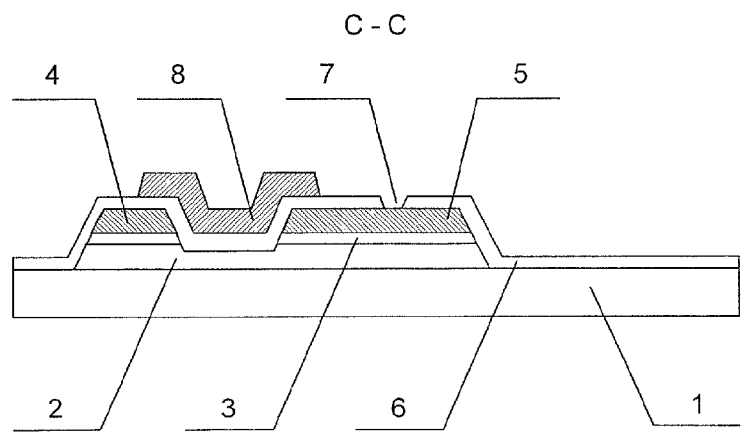
FIG. 10 is a schematic view showing a TFT-LCD array substrate after a third etching process during the second patterning process according to the first embodiment of the present invention.

FIG. 10 is a sectional view taken along the line C-C in FIG. 5 and showing a TFT-LCD array substrate after a third etching process during the second patterning process. The first insulating layer 6 is etched so that the insulating layer 6 at a position corresponding to the insulating layer via hole 7 is completely removed and the underlying drain electrode 5 is exposed, as shown in FIG. 10.

Figure 11:
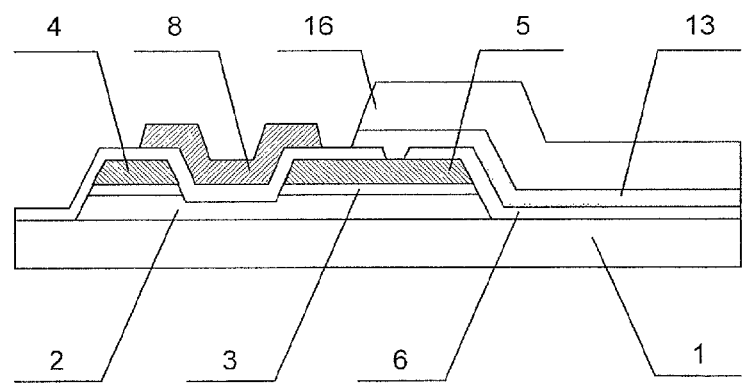
FIG. 11 is a schematic view showing a TFT-LCD array substrate after forming a pixel electrode during a third patterning process according to the first embodiment of the present invention.

FIG. 11 is a sectional view taken along the line A-A in FIG. 1 and showing the TFT-LCD array substrate after forming a pixel electrode during a third patterning process. A transparent conductive film is deposited on the substrate with the above faulted patterns by a magnetron sputtering method, a thermal evaporation method or the like. For example, the transparent conductive film may be formed of indium tin oxide (ITO) or indium zinc oxide (IZO), or transparent conductive materials. The transparent conductive film in the pixel region and in the region other than the insulating layer via hole is removed by a patterning process through a normal mask so as to form a pixel electrode 13. As shown in FIG. 11, the pixel electrode 13 is connected with the drain electrode 5 through the insulating layer via hole 7 and is covered by the photoresist layer 16 for patterning.

Figure 12:
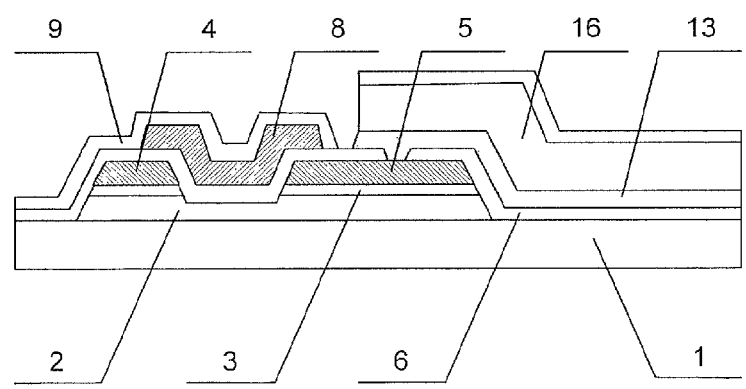
FIG. 12 is a schematic view showing a TFT-LCD array substrate after forming a second insulating layer during the third patterning process according to the first embodiment of the present invention.

FIG. 12 is a sectional view taken along the line A-A in FIG. 1 and showing the TFT-LCD array substrate after forming a second insulating layer during the third patterning process. A second insulating layer 9 is deposited on the substrate on which the remained photoresist is not removed so that the substrate is entirely covered by the second insulating layer 9. Since the photoresist 16 on the pixel electrode 13 is remained, the second insulating layer 9 above the pixel electrode 13 covers the remained photoresist 16, as shown in FIG. 12. Finally, the second insulating layer 9 on the photoresist is removed along with the photoresist by a lifting-off process, and thereby the TFT-LCD array substrate according to the first embodiment of the present invention shown in FIG. 1 and FIG. 2 is obtained.

In the above embodiment, the above-described second insulating layer for insulating may be formed by other methods, for example, this layer may be an insulating metal oxide film formed by a thermal oxidation process. Specifically, a lifting-off process for the photoresist is immediately performed after the pixel electrode 13 is formed, and then the exposed surface of the gate electrode and the gate line is oxidized so that the insulating metal oxide film can be formed on the gate electrode and the gate line. The oxidization can be performed through a thermal oxidization process.

During the process for manufacturing the TFT-LCD array substrate, a plurality of common electrodes, a plurality of storage capacitors and the like may also be formed, and a plurality of gate connecting lines and a plurality of data connecting lines may be respectively formed in the gate line PAD region and the data line PAD region around the pixel regions on the substrate.

Specifically, in the data line PAD region, the semiconductor layer, the doped semiconductor layer and the metal film for source and drain electrodes are deposited and patterned during the first patterning process. During the second patterning process, the first insulating layer and the gate metal film are deposited in this region; the gate metal film and the first insulating layer are etched in the first etching process to form the insulating layer via holes, at the bottom of which the first insulating layer with remaining thickness is left; the gate metal film is completely removed in the second etching process; and in the third etching process, the first insulating layer corresponding to the insulating layer via holes is completely removed and the drain electrodes are exposed. During the third patterning process, the transparent conductive film is deposited in this region and then the second insulating layer is deposited on the remaining photoresist for patterning, and finally the remaining photoresist is removed along with the second insulating layer thereon in this region by a lifting-off process so that the data connecting lines are formed in this region.

In the gate line PAD region, the semiconductor layer, the doped semiconductor layer and the metal film for source and drain electrodes are deposited and removed during the first patterning process. During the second patterning process, the first insulating layer and the gate metal film are deposited in this region, and the gate metal film is removed in the second etching process and the first insulating layer is remained. During the third patterning process, the transparent conductive film is deposited in this region and then the second insulating layer is deposited on the remaining photoresist for patterning, finally the remaining photoresist is removed along with the second insulating layer thereon in this region by a lifting-off process so that the gate connecting lines are formed in this region.

Figure 13:
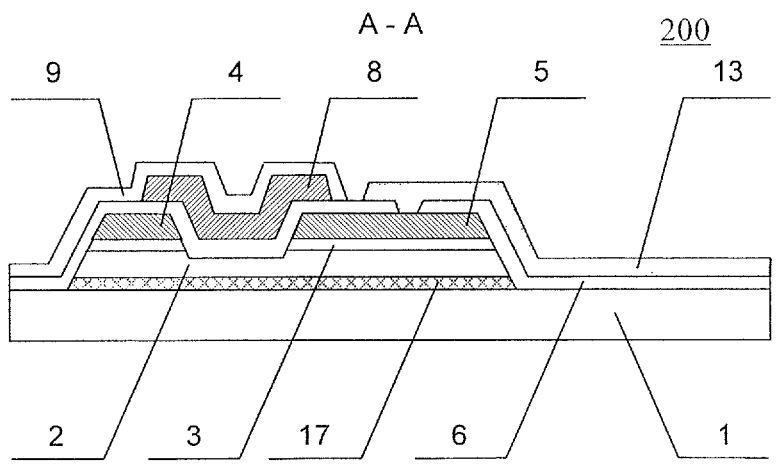
FIG. 13 is a schematic view showing a structure of a TFT-LCD array substrate according to a second embodiment of the present invention.

FIG. 13 is a sectional view taken along the line A-A in FIG. 1 and showing a structure of a TFT-LCD array substrate according to a second embodiment of the present invention. The structure of the array substrate 200 in the second embodiment is basically identical with that in the first embodiment except that a light-shielding layer 17 is formed on the base substrate 1. Specifically, the light-shielding layer 17 is formed between the base substrate 1 and the semiconductor layer 2 to prevent light from being incident on the TFT channel region, and thus the reliability of the thin film transistors can be improved.

Figure 14:
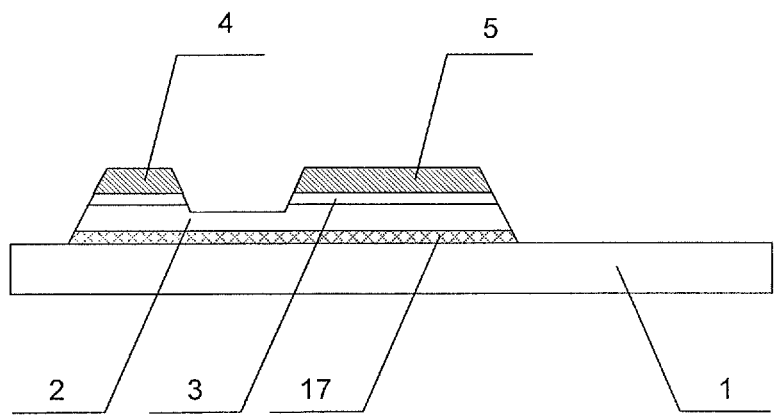
FIG. 14 is a schematic view showing a TFT-LCD array substrate after a first patterning process according to the second embodiment of the present invention.

FIG. 14 is a sectional view taken along the line B-B in FIG. 3 and showing the TFT-LCD array substrate after a first patterning process according to the second embodiment of the present invention. The process for manufacturing the TFT-LCD array substrate according to the second embodiment is identical with that for manufacturing the TFT-LCD array substrate according to the first embodiment except forming a light-shielding layer 17 between the base substrate 1 and the semiconductor layer 2. Specifically, the light-shielding layer 17, the semiconductor layer 2 and the doped semiconductor layer (ohmic contact layer) 3 are firstly deposited sequentially on the base substrate 1 (e.g., a glass substrate or a quartz substrate) for example by a chemical vapor deposition method or the like, and then a metal film for source and drain electrodes is deposited for example by a magnetron sputtering method, a thermal evaporation method or the like. The light-shielding layer 17, the semiconductor layer 2, the doped semiconductor layer 3 and the metal film for source and drain electrodes are patterned through a gray-tone mask by the first patterning process so that data lines 11, a source electrode 4, a drain electrode 5 and a TFT channel region are formed on the substrate. At this time, the doped semiconductor layer 3 between the source electrode 4 and the drain electrode 5 is completely removed and thus the semiconductor layer is exposed, and the light-shielding layer 17 is provided below the data line, the source electrode, the drain electrode and the TFT channel region. The second and the third patterning processes according to the present embodiment are substantially identical with those according to the first embodiment, and the second insulating layer for insulating in the present embodiment may also be an insulating metal oxide film formed by an oxidation process. Therefore, the following processes in the present embodiment are not explained again for simplicity.

A method for manufacturing a TFT-LCD array substrate according to a first embodiment of the present invention comprises the following steps:

Step 1 of depositing a semiconductor layer, a doped semiconductor layer and a metal film for source and drain electrodes sequentially on a base substrate and then forming a data line, a source electrode, a drain electrode and a thin film transistor (TFT) channel region by a first patterning process;

Step 2 of depositing a first insulating film and a gate metal film sequentially on the substrate after the step 1 and then forming a gate line and a gate electrode by a second patterning process and forming an insulating layer via hole in the first insulating layer above the drain electrode;

Step 3 of depositing a transparent conductive film on the substrate after the step 2 and then forming a pixel electrode by a third patterning process, which is connected with the drain electrode through the insulating layer via hole; and Step 4 of forming a second insulating layer on the substrate after the step 3.

Firstly, the semiconductor layer and the doped semiconductor layer (ohmic contact layer) are deposited sequentially on the base substrate (e.g., a glass substrate or a quartz substrate) by a chemical vapor deposition method or the like, and the semiconductor layer and the doped semiconductor layer constitute the active layer; then the metal film for source and drain electrodes is deposited by a magnetron sputtering method, a thermal evaporation method or the like, and the metal film for source and drain electrodes may be a single layer of molybdenum, aluminum, aluminum neodymium alloy, tungsten, chromium, copper or the like or a multilayer of two or more metals selected form above-mentioned metals. The semiconductor layer, the doped semiconductor layer and the metal film for source and drain electrodes are patterned through a gray-tone mask by the first patterning process so that the data line, the source electrode, the drain electrode and the TFT channel region are formed on the substrate, and the doped semiconductor layer between the source electrode and the drain electrode is completely removed and the underlying semiconductor layer is exposed. The doped semiconductor layer is used to improve the electrical conductivity between the semiconductor layer and the metal film for source and drain electrodes. If the materials used for the semiconductor layer and the metal film for source and drain electrodes have desirable conductivity therebetween, a structure without the doped semiconductor layer, i.e., a structure in which the metal film for source and drain electrodes directly deposited on the semiconductor layer may be used.

The second patterning process in the method for manufacturing the TFT-LCD array substrate according to the first embodiment of the present invention comprises the following steps:

Step 21 of depositing the first insulating layer on the substrate after step 1 and then depositing the gate metal film;

Step 22 of applying a photoresist layer on the gate metal film;

Step 23 of performing an exposure and development process so that the photoresist layer is formed into a completely removed region, a partially remained region and a completely remained region;

Step 24 of performing a first etching process so that the gate metal film at a position corresponding to the insulating layer via hole is completely removed and the first insulating layer at this position is partially removed in the thickness direction;

Step 25 of performing an ashing process to completely remove the photoresist in the partially remained region;

Step 26 of performing a second etching process to form gate lines and the gate electrode; and Step 27 of performing a third etching process so that the first insulating layer at the position corresponding to the insulating layer via hole is completely removed and the drain electrode is exposed.

The first insulating layer is deposited by a chemical vapor deposition method or the like, and then the gate metal film is deposited by a magnetron sputtering method, a thermal evaporation method or the like, and the gate metal film may be a single layer of molybdenum, aluminum, aluminum neodymium alloy, tungsten, chromium, copper or the like or a multilayer of two or more metals selected form above-mentioned metals. The photoresist layer is applied on the gate metal film, and then exposed through a gray-tone mask so as to form a completely exposed region (i.e., a region where the photoresist is to be removed completely), a partially exposed region (i.e., a region where the photoresist is to be remained partially) and an un-exposed region (i.e., a region where the photoresist is to be remained completely), and the region where the gate line and the gate electrode are to be formed corresponds to the un-exposed region, the region where the insulating layer via hole is to be formed above the drain electrode corresponds to the completely exposed region, and the remaining region corresponds to the partially exposed region. After development of the photoresist layer that has been exposed, the photoresist in the completely exposed region is completely removed; the photoresist in the partially exposed region is partially removed; and the photoresist in the un-exposed region is remained completely. The gate metal film exposed by the photoresist is completely removed and the first insulating layer is partially removed in the thickness direction by the first etching process so that the insulating layer via hole is formed in the first insulating layer. The insulating layer via hole is formed above the drain electrode, and since the first insulating layer is partially removed in the thickness direction, the first insulating layer with remaining thickness is left at the bottom of the insulating layer via hole. The ashing process is performed so that the photoresist in the partially exposed region is removed completely and the photoresist in the un-exposed region covers the region where the gate electrode is to be formed, but the thickness thereof is reduced. By the second patterning process, the gate metal film exposed by the photoresist is removed and then the remaining photoresist is lifted-off so that the gate lines and the gate electrode on the TFT channel region are formed. Finally, the first insulating layer is etched through the third etching process so that the first insulating layer at the position of the insulating layer via hole is completely removed and the drain electrode is exposed.

Then, the transparent conductive film is deposited on the substrate with the above-formed patterns by a magnetron sputtering method, a thermal evaporation method or the like. The transparent conductive film may be formed of indium tin oxide (ITO) or indium zinc oxide (TZO), or transparent conductive materials. The transparent conductive film in the pixel region and in the region other than the insulating layer via hole is removed by a patterning process through a normal mask so that the pixel electrode is formed, and the pixel electrode is connected with the drain electrode through the insulating layer via hole.

In addition, the second insulating layer formed in step 4 may be a gate insulating layer formed by a deposition method or an insulating metal oxide film formed by an oxidation method. As for the deposition method, after forming the pixel electrode, the gate insulting layer is deposited on the substrate on which the remained photoresist is not removed so that the substrate is entirely covered by the gate insulating layer, and since the photoresist on the pixel electrode is remained, the gate insulating layer above the pixel electrode covers the photoresist, finally the photoresist is removed along with the gate insulating layer thereon by a lifting-off process. On the other hand, as for the oxidation method, a lifting-off process for the photoresist is immediately performed after forming the pixel electrode, and then the exposed surface of the gate electrode and the gate lines is oxidized so that the insulating metal oxide film is formed.

A method for manufacturing a TFT-LCD array substrate according to a second embodiment of the present invention comprises the following steps:

Step 1' of depositing a light-shielding layer, a semiconductor layer, a doped semiconductor layer and a metal film for source and drain electrodes sequentially on a base substrate and then forming a data line, a source electrode, a drain electrode and a thin film transistor (TFT) channel region by a first patterning process;

Step 2' of depositing a first insulating film and a gate metal film sequentially on the substrate after the step 1' and then forming a gate line and a gate electrode by a second patterning process and forming an insulating layer via hole in the first insulating layer above the drain electrode;

Step 3' of depositing a transparent conductive film on the substrate after the step 2' and then forming a pixel electrode by a third patterning process, which is connected with the drain electrode through the insulating layer via hole; and Step 4' of forming a second insulating layer on the substrate after the step 3'.

The method for manufacturing the TFT-LCD array substrate according to the second embodiment is identical with that for manufacturing the TFT-LCD array substrate according to the first embodiment except that the light-shielding layer is formed between the substrate and the semiconductor layer in the step 1'. The light-shielding layer is used to prevent light from being incident on the TFT channel region so that the reliability of the thin film transistor may be improved.

With embodiments of the present invention, the technical problem that photoresist is prone to be modified during the sputtering process and thus the pixel region is polluted can be overcome, and the process for manufacturing the TFT-LCD can be more easily completed and thus the production yield is efficiently increased. In addition, the number of the masks to be used is reduced in the 3-mask process of the present invention, thereby the production cost is greatly reduced and the production capacity is substantially improved.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method for manufacturing a liquid crystal display (LCD) array substrate comprising:
   step 1 of depositing a semiconductor layer, a doped semiconductor layer and a metal film for source and drain electrodes sequentially on a base substrate and then forming a data line, a source electrode, a drain electrode and a thin film transistor (TFT) channel region by a first patterning process;

step 2 of depositing a first insulating film and a gate metal film sequentially on the substrate after the step 1 and then forming a gate line and a gate electrode by a second patterning process, wherein an insulating layer via hole is formed in the first insulating layer above the drain electrode, and the gate electrode is positioned above the TFT channel region, wherein the step 2 comprises:

step 21 of depositing the first insulating layer on the substrate after step 1 and then depositing the gate metal film;

step 22 of applying a first photoresist layer on the gate metal film;

step 23 of performing an exposure and development process so that the first photoresist layer is formed into a completely removed region, a partially remained region and a completely remained region, wherein the region where the gate line and the gate electrode are to be formed corresponds to the completely remained region, the region where the insulating layer via hole is to be formed above the drain electrode corresponds to the completely removed region, and the remaining region on the substrate corresponds to the partially remained region;

step 24 of performing a first etching process so that the gate metal film at a position corresponding to the insulating layer via hole is completely removed and the first insulating layer at this position is partially removed in the thickness direction;

step 25 of performing an ashing process to completely remove the first photoresist layer in the partially remained region;

step 26 of performing a second etching process to form the gate line and the gate electrode; and step 27 of performing a third etching process so that the first insulating layer at the position corresponding to the insulating layer via hole is completely removed and the drain electrode is exposed;

step 3 of depositing a transparent conductive film on the substrate after the step 2 and then forming a pixel electrode by a third patterning process utilizing a second photoresist layer, wherein the pixel electrode is connected with the drain electrode through the insulating layer via hole; and step 4 of forming a second insulating layer on the substrate after the step 3 to cover the gate line and gate electrode.

2. The method according to claim 1, wherein the step 4 comprises:

depositing the second insulating layer on the substrate on which a remaining portion of the second photoresist layer is not removed after forming the pixel electrode so that the substrate is entirely covered by the second insulating layer, and then removing the second insulating layer on the remaining portion of the second photoresist layer along with the remaining portion of the second photoresist layer by a lifting-off process.

3. The method according to claim 2, wherein a light-shielding layer is deposited on the substrate prior to depositing the semiconductor layer in the step 1.

4. The method according to claim 1, wherein the step 4 comprises:

performing a process for removing a remaining portion of the second photoresist layer after forming the pixel electrode, and then oxidizing the exposed surface of the gate electrode and the gate lines so that an insulating metal oxide film is formed.

5. The method according to claim 4, wherein a light-shielding layer is deposited on the substrate prior to depositing the semiconductor layer in the step 1.

6. The method according to claim 1, wherein a light-shielding layer is deposited on the substrate prior to depositing the semiconductor layer in the step 1.

* * * * *